United States Patent
Stiegler et al.

(10) Patent No.: US 9,042,173 B2
(45) Date of Patent: May 26, 2015

(54) EFFICIENT MEMORY SENSE ARCHITECTURE

(75) Inventors: Harvey J. Stiegler, Plano, TX (US); Luan A. Dang, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 94 days.

(21) Appl. No.: 12/696,766

(22) Filed: Jan. 29, 2010

(65) Prior Publication Data
US 2011/0188311 A1 Aug. 4, 2011

(51) Int. Cl.
*G11C 16/04* (2006.01)
*G11C 16/06* (2006.01)
*G11C 7/02* (2006.01)

(52) U.S. Cl.
CPC *G11C 7/02* (2013.01); *G11C 16/04* (2013.01); *G11C 16/06* (2013.01)

(58) Field of Classification Search
None
See application file for complete search history.

(56) References Cited

U.S. PATENT DOCUMENTS

| | | | |
|---|---|---|---|
| 4,481,609 A * | 11/1984 | Higuchi et al. | 365/185.05 |
| 5,528,543 A | 6/1996 | Stiegler | |
| 5,773,997 A | 6/1998 | Stiegler | |
| 5,940,321 A * | 8/1999 | Takeuchi et al. | 365/185.17 |
| 2004/0047216 A1* | 3/2004 | Ishikawa et al. | 365/210 |
| 2008/0198683 A1* | 8/2008 | Oosaka | 365/230.06 |
| 2010/0259960 A1* | 10/2010 | Samachisa | 365/51 |

* cited by examiner

*Primary Examiner* — James G Norman
(74) *Attorney, Agent, or Firm* — Rose Alyssa Keagy; Frank D. Cimino

(57) ABSTRACT

Memory architecture, such as for a flash EEPROM memory embedded within a processor or other large scale integrated circuit, and including differential sense circuitry. The memory includes an array of memory cells in rows and columns, and organized into sectors, each sector split into portions. Columns of the array are grouped into small groups from which a final stage column decode selects a column from the group based on the least significant bits of the column address. Adjacent groups of columns are paired, with a selected column from each group coupled to a differential input of the sense amplifier, but with one of the selected columns associated with an unselected sector portion and thus serving as a dummy bit line. Conductor routing is simplified, and chip area is reduced, by maintaining unselected column groups adjacent or nearby to selected column groups.

17 Claims, 11 Drawing Sheets

FIG. 3
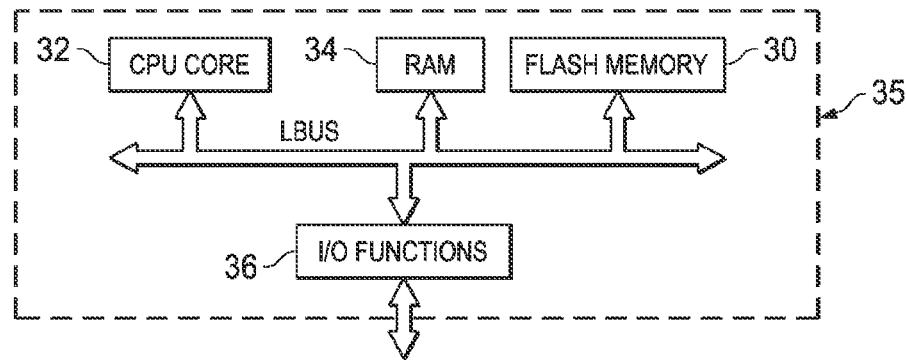
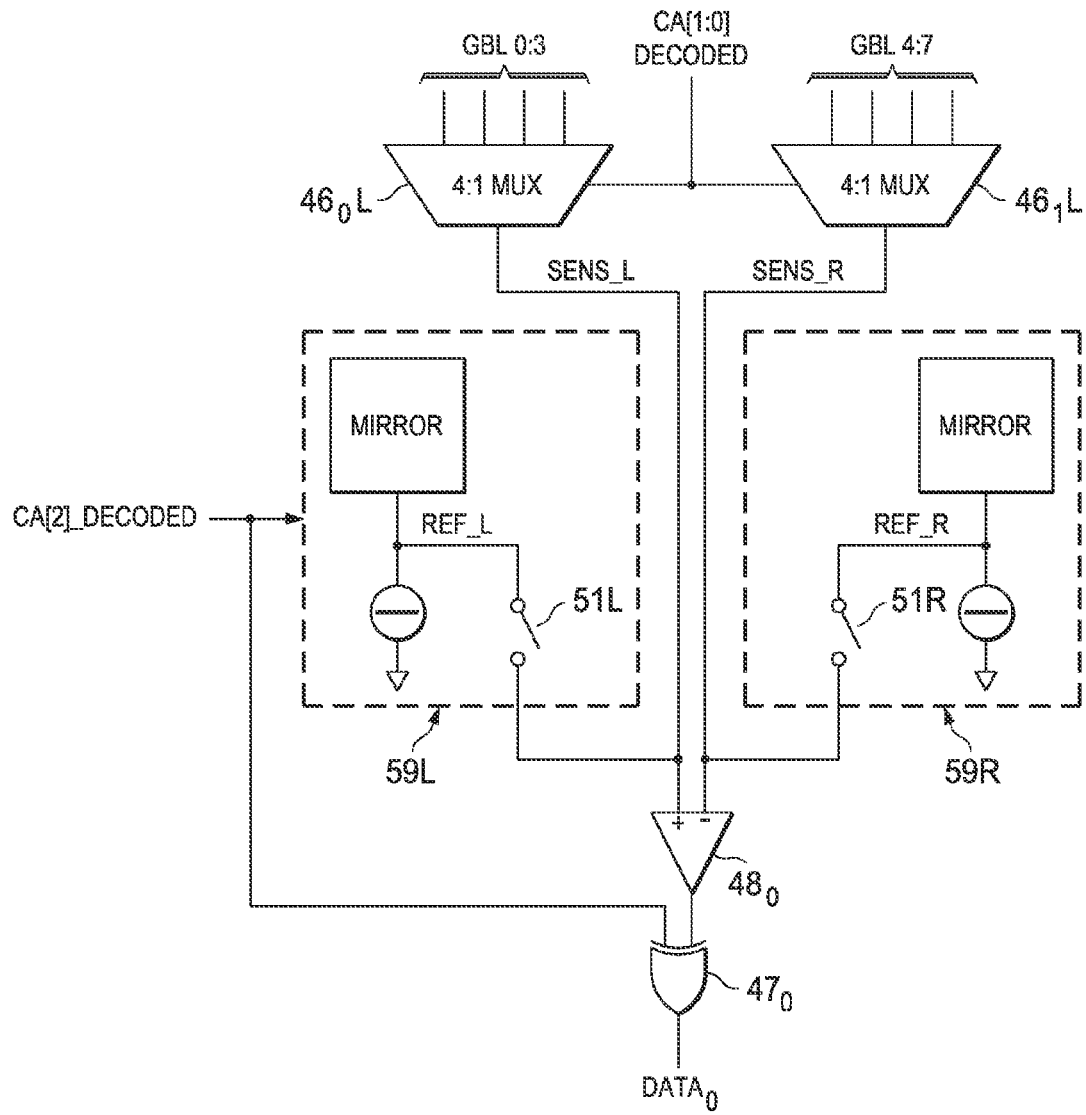
FIG. 7

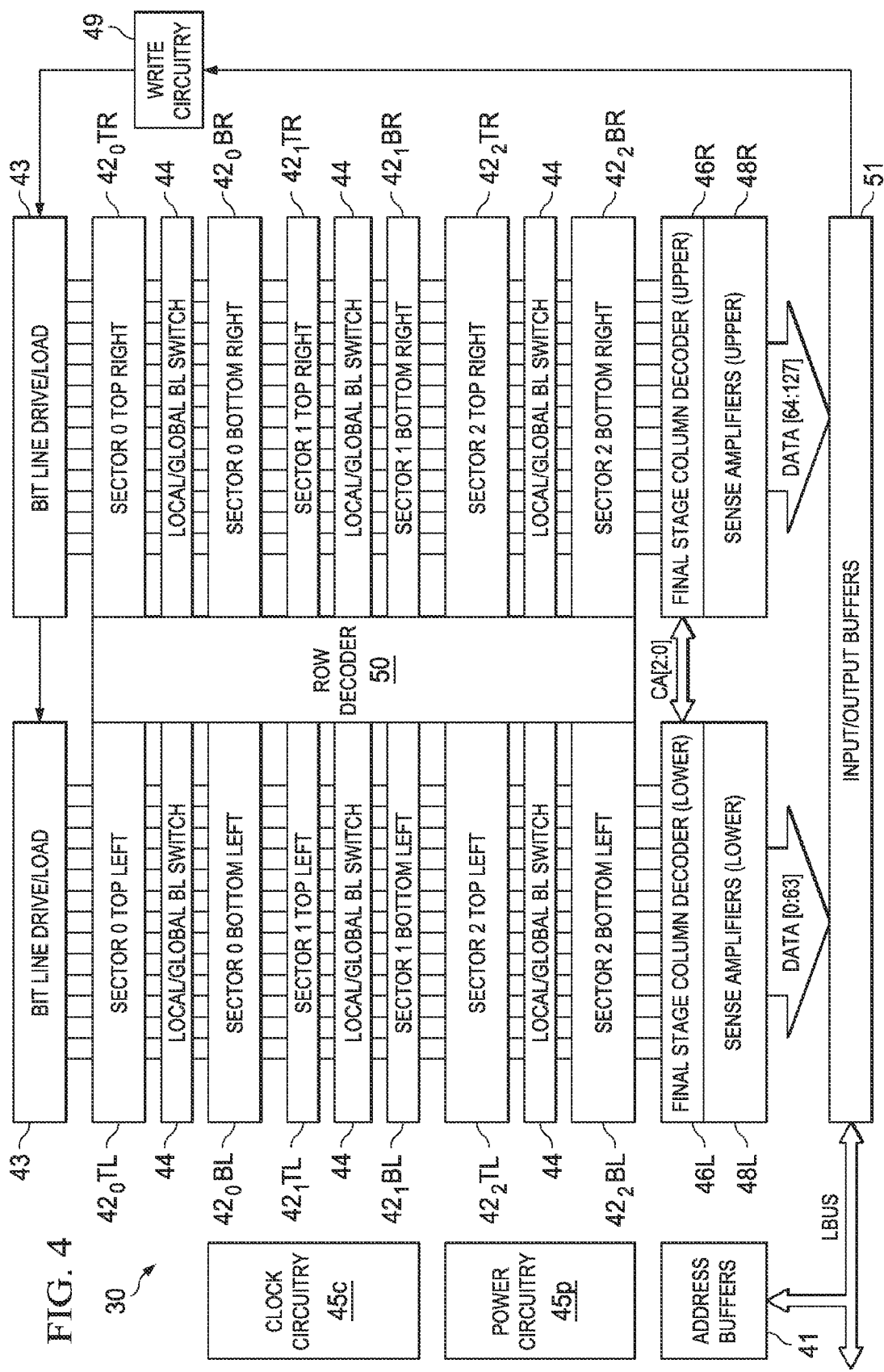

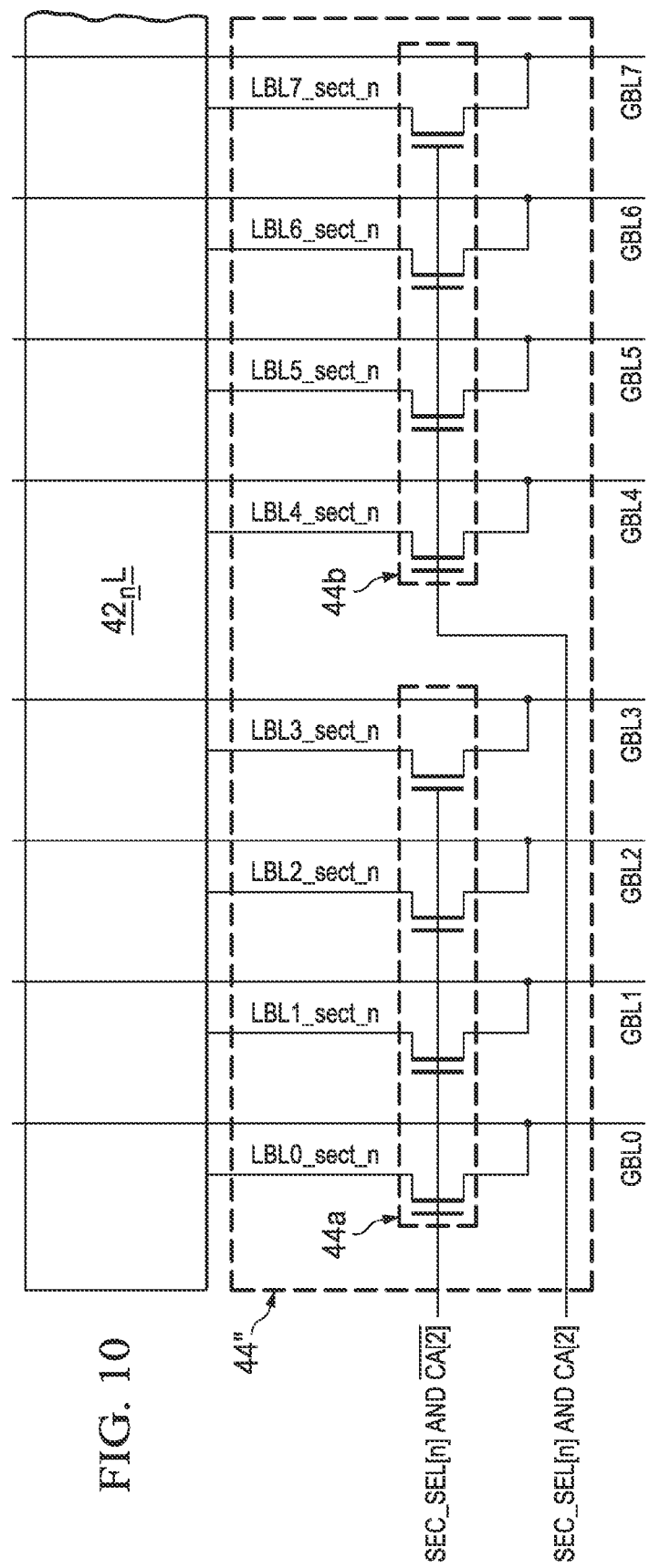

EFFICIENT MEMORY SENSE ARCHITECTURE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor memory. Embodiments of this invention are more specifically directed to the sensing of stored data states in an electrically erasable read-only memory of the flash type.

Semiconductor or solid-state memory is now commonplace in many electronic systems, ranging from large-scale computers to portable electronic devices and systems. Various types of semiconductor memory are available in the marketplace, each with its own benefits rendering it useful in particular applications. For example, dynamic random access memory (DRAM) provides high capacity data storage at a low cost per bit, with each memory location individually addressable, but DRAM contents require periodic refresh and are volatile upon power down. Static RAM (SRAM) is also randomly addressable and volatile on power-down, but provides high-speed data access at a cost of reduced density relative to DRAM. Mask-programmable read-only memory (ROM) provides dense non-volatile data storage, but cannot be altered.

In recent years, non-volatile read/write solid-state memory devices have become popular, particularly in portable electronic devices and systems in which it can replace magnetic disk drive storage. A common technology for realizing non-volatile solid-state memory devices is referred to as electrically erasable programmable read-only memory (EEPROM), and utilizes floating-gate transistors to store the data state. According to this technology, a memory cell transistor is programmed (i.e., written) by biasing it so that hot carrier injection causes electrons to become trapped on an electrically isolated transistor gate element. These trapped electrons on the floating gate raise the apparent threshold voltage of the memory cell transistor (for n-channel devices), as compared with its threshold voltage with no electrons trapped on the floating gate. Typically, an erased cell (data state "1") conducts current when the transistor is biased to a read state, while a programmed cell (data state "0") does not conduct current at that read state because of the electrons trapped on the floating gate element. The stored state can be read by sensing the presence or absence of source-drain conduction under bias, and erased by biasing the transistor so that the floating-gate electrons tunnel to the source or drain. Some EEPROM memory devices are of the "flash" type, in that a large number (a "block") of memory cells can be simultaneously erased in a single operation.

In any type of solid-state semiconductor memory, the sensing of data stored in a selected memory cell is a critical operation. Accurate sensing of the stored memory cell state must be maintained over varying voltage and temperature conditions, variations in manufacturing parameters, and in the presence of system noise. As a result, precision sense circuitry plays a role in determining the memory density in bits per unit "chip" area (and thus in the cost-per-bit of manufacturing the memory), because the noise margin of the sense circuitry in large part determines the minimum memory cell size. As such, many types and arrangements of sense circuitry have been developed for and implemented in solid-state memory over the years.

One particularly useful design for sense circuitry in flash memory is the balanced sense amplifier circuit described in U.S. Pat. Nos. 5,528,543 and 5,773,997, both commonly assigned with this application and both incorporated herein by this reference. According to this approach, the sense amplifier circuitry includes a differential amplifier that compares a level at one input that is defined by the state of the selected memory cell with a reference level established by a reference circuitry present at its other input. In the architecture described in these U.S. Pat. Nos. 5,528,543 and 5,773,997, sense circuitry is positioned between upper and lower blocks of a memory array, so that the sense amplifier input can be coupled to a selected memory cell (and the other input coupled to reference circuitry) in either one of the upper and lower array blocks.

FIGS. 1a and 1b illustrate a conventional flash memory sense architecture, for example utilizing the balanced sense amplifier approach described in U.S. Pat. Nos. 5,528,543 and 5,773,997. In this example, floating-gate memory cells 5 are arranged into upper and lower sectors 2U, 2L. While only one row of memory cells 5 is shown in FIG. 1a as within each of sectors 2U, 2L, it will of course be understood that each of these sectors 2U, 2L will include many such rows. Each memory cell 5 in the illustrated row of upper sector 2U has a control gate driven by a word line $WLU_j$, and each memory cell 5 in the row of lower sector 2L has its control gate driven by word line $WLL_j$. The drain of the floating-gate transistor of each memory cell 5 in the row is connected to a separate bit line BL from the other memory cells 5 in that row; each bit line is also connected to those memory cells 5 in the same column but in other rows in the same sector (not shown in FIG. 1a). The source nodes of the floating-gate transistors in memory cells 5 are biased to ground, as shown in FIG. 1a.

The arrangement of FIG. 1a illustrates the sensing of a single selected data bit in this conventional memory. In this example, upper 8:1 column multiplexer 4U receives each of the eight bit lines BL coupled to the drains of memory cells 5 in the rows of upper sector 2U; similarly, lower 8:1 column multiplexer 4L receives the eight bit lines BL for memory cells 5 in lower sector 2L. Each of column multiplexers 4U, 4L receive three bits of a column address COL[2:0], the value of which selects one of the eight bit lines BL (i.e., one column) for communication to sense amplifier 8; because only one row in one of upper and lower sectors 2U, 2L is selected by a corresponding row address value, the state of a single selected memory cell 5 will be sensed by sense amplifier 8 in this example.

According to the balanced sense amplifier approach described in U.S. Pat. Nos. 5,528,543 and 5,773,997, sense amplifier 8 is a differential amplifier with a positive input receiving a level corresponding to current conducted by the selected memory cell 5, and a negative input receiving a reference level. In this example, switching network 9 connects the bit line selected by one of multiplexers 4U, 4L and a reference line to the appropriate inputs of amplifier 8. In the example of FIG. 1a, switching network 9 includes switches 3U, 3L that connect one of corresponding sense output lines SENS_U, SENS_L from multiplexers 4U, 4L respectively, to the positive input of amplifier 8, and switches 7U, 7L that connect one of corresponding reference current lines BAL_U, BAL_L, respectively, to the negative input of amplifier 8. Switches 3, 7 are controlled by the state of the row address bit that indicates whether a row in upper sector 2U or in lower sector 2L is selected (e.g., address bit ROW[m] in this example).

Other sense arrangements can also be used in this architecture. For example, the bit line BL from an unselected sector 2U, 2L may itself present a load to amplifier 8 that serves as the sensing reference, perhaps with "dummy" cell coupled to that bit line BL (e.g., conducting half of the full-state current of memory cell 5), to establish the sensing reference. These and other reference or dummy arrangements are well-known in the art. In any case, switches 7U, 7L serve to connect to the negative input of amplifier 8 to a sensing reference from the corresponding sector 2U, 2L not containing the selected row.

In the example of the read operation shown in FIG. 1a, the selected row resides in upper sector 2U. Word line $WLU_j$ for this selected row is driven by a row decoder (not shown) to a high voltage (e.g. 4.5 volts) and this high voltage is applied to the control gates of all memory cells 5 in that row. The word lines for unselected rows, including the corresponding word line $WLL_j$ in lower sector 2L that has the same row address as selected word line $WLU_j$ except for row address bit ROW[m], are driven with a low voltage (e.g., ground) by the row decoder. This low word line voltage ensures that memory cells 5 in unselected rows do not conduct any current relative to their bit lines BL. A bias voltage is applied to all bit lines BL (by circuitry not shown in FIG. 1a), for example as described in U.S. Pat. Nos. 5,528,543 and 5,773,997. The current drawn by the memory cell 5 in the selected column is reflected in the current forwarded to the positive input of sense amplifier 8 via sense output line SENS_U and switch 3U. Meanwhile, because of the state of row address bit ROW[m], switches 3L and 7U are open and switch 7L is closed, coupling the reference current established by circuitry within column multiplexer 4L (see U.S. Pat. Nos. 5,528,543 and 5,773,997) to the negative input of sense amplifier 8. Sense amplifier 8 thus issues a logic level on line DATA corresponding to the state of the selected memory cell 5 in row j and column k of upper sector 2U.

FIG. 1b illustrates the construction of flash memory 10 using the sense architecture described above relative to FIG. 1a. In this example, four upper sectors $2_0U$ through $2_3U$ and four lower sectors $2_0L$ through $2_3L$ are provided, separated by column decoders 4U, 4L, and balanced sense circuitry 8 in the manner shown in FIG. 1a. Upper row decoder 12U drives word lines across upper sectors $2_0U$ through $2_3U$, and lower row decoder 12L drives word lines across lower sectors $2_0L$ through $2_3L$. Balanced sense circuitry 8 (specifically switching circuitry 9 therein) receives row address bit ROW[m] so that it connects the selected column bit lines BL to the corresponding differential amplifiers, as described above. The number of data bits output (in a read cycle) on output data lines DATA depends on the number of columns selected by a single value of the column address.

The arrangement of FIG. 1b is somewhat constraining, however. First of all, an even number of sectors 2 is required, considering that each upper sector 2U must have a counterpart lower sector 2L, and vice versa, for balanced sensing. In addition, each sector 2 must have the same number of rows as any other sector. Typically, the number of columns in each sector 2 is also uniform across memory 10, to facilitate column decoding. Indeed, this uniformity in sector size is typically also reflected in the architecture of the flash erase circuitry (not shown), in that each sector 2 corresponds to the smallest unit of erase in flash memory 10 (i.e., all memory cells 5 in a given sector are erased in a single erase operation). In some applications, such as for flash memory devices utilized for mass storage (e.g., flash memory cards for cameras, music players, mobile telephones, or disk drive replacement), and the like, these limitations are acceptable.

However, in many applications, it has been discovered that the limitations presented by the architecture of flash memory 10 of FIGS. 1a and 1b can be too constraining for efficient flash memory implementation and utilization. Those limitations are especially constraining in embedded flash memory within a larger-scale integrated circuit, such as a microprocessor, digital signal processor, or other large scale logic device. In such embedded applications, it is often useful to have sectors (i.e., smallest erase blocks) of varying sizes, so that individual sectors can be optimized for a particular function that is called upon by the logic circuitry in the device within which the flash memory is embedded. It is not cost efficient to dedicate an overly-large flash memory block to a particular logic circuit function, because of the chip area unnecessarily consumed by the flash memory cells that will seldom if ever be written. In addition, the requirement of an even number of sectors may waste the chip area of an additional sector that will be under-utilized in practice.

FIGS. 2a and 2b illustrate flash memory 20 according to another conventional architecture. In this approach, as shown generally in FIG. 2a, three sectors $22_0$ through $22_2$ are realized, all served by row decoder 23. Sectors $22_0$ through $22_3$ have different numbers of rows, as evident from their different sizes as shown in FIG. 2a, and each is split into left and right sector halves (e.g., sector $22_0$ is realized as left sector half $22_0L$ and right sector half $22_0R$), with row decoder 23 disposed between those halves. Each sector $22_j$, including each of its halves $22_jL$, $22_jR$, have their bit lines forwarded to final stage column decodes 24, which itself is split into left and right halves 24L, 24R. Sense circuitry portions $18_0$, $18_1$ have inputs receiving output lines from final stage column decodes 24, and provide an output word of multiple bit width (e.g., ranging to as many as 64 or 128 bits wide or wider, depending on the organization) in response to each address.

In operation, each row corresponding to a particular row address value extends across both halves $22_jL$, $22_jR$ of the sector $22_j$; in this arrangement, only one row in all the sectors is selected. While the least significant bits of the applied column address (in this case, the two least significant bits CA[1:0]) are applied to final stage column decoders 24L, 24R to define the final selection of bit lines to be forwarded to sense circuitry 18, another column address bit (in this example, CA[2]) indicates whether the selected bit lines reside in the left sector half $22_0L$, $22_1L$, $22_2L$ containing the addressed row, or in the right sector half $22_0R$, $22_1R$, $22_2R$. That column address bit is communicated both to row decoder 23, and also to column decodes 24L, 24R. In this arrangement, this column address bit controls switching circuitry (e.g., contained within final stage column decodes 24L, 24R) so that the selected bit lines are forwarded from the selected sector half to one input of each of the differential amplifiers in sense circuitry $18_0$, $18_1$, and so that bit lines of unselected sector halves (constituting "dummy" bit lines serving as a capacitive load for establishing a reference level) are forwarded to the other inputs of those differential amplifiers. Each column decoder 24L, 24R presents an output line to an input of its differential amplifier 18.

FIG. 2b illustrates the connection and operation of sense circuitry relative to a selected row in the arrangement of FIG. 2a, in further detail. In the example shown in FIG. 2a, the selected columns reside in left sector half $22_jL$ and not in right sector half $22_jR$. As such, left final stage decoder 24L will couple selected bit lines to sense circuitry $18_0$, $18_1$, and right final stage decoder 24R will couple dummy bit lines to sense circuitry $18_0$, $18_1$. Left final stage decoder 24L is constructed as a bank of 4:1 multiplexers $25_0$L through $25_{127}$L in this example, each receiving four bit lines from associated columns in sector $22_j$L; similarly, right final stage decoder 24R is constructed from 4:1 multiplexers $25_0$R through $25_{127}$R, each receiving four bit lines from associated columns in sector $22_j$R. For example, 4:1 multiplexer $25_0$L receives bit lines from columns c0 through c3 in sector $22_j$, multiplexer $25_1$L receives bit lines from columns c4 through c7, multiplexer $25_0$R receives bit lines from columns c512 through c515, and so on until multiplexer $25_{127}$R receives bit lines from columns c1020 through c1023 (there being 1024 columns in each sector of this example). Each of these multiplexers 25 select one of its four bit lines in response to decoded signals based on the least significant bits CA[1:0] of the column address.

Each multiplexer $25_k$ presents an output line that is coupled to an input of a corresponding differential amplifier $28_k$. This output line corresponds to either a selected bit line, or to a dummy (or reference) output line, depending on the state of column address bit CA[2] in this example; logic (not shown) is provided within sense circuitry $18_0$, $18_1$ to resolve the proper logic output level, also depending on the state of column address bit CA[2]. Flash memory 20 presents a 128-bit output word in each read operation, and as such sense circuitry 18 includes 128 differential amplifiers $28_0$ through $28_{127}$. In this example, in which the selected columns reside in left sector half 24, the outputs of multiplexer $25_0$L through multiplexer $25_{127}$L present levels corresponding to the contents of selected memory cells to one input of respective differential amplifiers $28_0$ through differential amplifier $28_{127}$; conversely, the outputs of multiplexers $25_0$R through multiplexer $25_{127}$R present a reference level to the other input of each of differential amplifiers $28_0$ through $28_{127}$, respectively. Differential amplifiers $28_0$ through $28_{127}$ present output levels corresponding to the sensed contents of the selected memory cells, with the correct polarity of those contents resolved by logic within sense circuitry $18_0$, $18_1$ depending on column address bit CA[2], in this example.

The arrangement of FIG. 2b overcomes some of the limitations of the conventional architecture of FIGS. 1a and 1b, in that the number of sectors 22 is not constrained to an even number, and in that the sizes of the sectors 22 can vary from one another. However, the chip area required to route the large number of interconnects between multiplexers 25 in final stage column decodes 24L, 24R and the inputs of differential amplifiers 28 is substantial. In particular, virtually every one of these interconnects must travel in both the x and y directions, with some of these interconnects traveling horizontally (in the view of FIG. 2b) a substantial distance. This change in direction typically requires two physical levels of conductors in order for these lines to cross over one another. Indeed, this routing is even more problematic than appears from FIG. 2b, considering that a dummy bit line from each of multiplexers $25_k$L in left final stage column decoder 24L is also coupled to the negative inputs of amplifiers $28_0$ through $28_{127}$, and that a sense output line from each of multiplexers $25_k$R in right final stage column decoder 24R is also coupled to the positive inputs of amplifiers $28_0$ through $28_{127}$.

Not only do these interconnections occupy substantial chip area and possibly result in increased process complexity, but the electrical performance of a memory constructed in this manner is degraded as a result. The long interconnections that must be routed according to this implementation necessarily insert significant parasitic impedances (resistance, inductance, capacitance) into the critical sense path, especially as the cross-sectional area of the conductive elements is reduced as much as possible in order to save chip area. In addition, as evident from FIG. 2b, direct interconnection paths to the inputs of each differential amplifier are of substantially different length. For example, in FIG. 2b, the distance to be traveled by the sense signal from multiplexer $25_0$L to differential amplifier $28_0$ is relatively short, but the distance traveled by the reference signal from multiplexer $25_0$R is much longer. In practice, to avoid sense amplifier imbalance because of these differences in interconnection path length, each of the interconnections to the differential amplifier inputs is extended across the full length of the array so that the parasitic loads are somewhat equivalent from line to line. Of course, this requires additional chip area for this extended interconnect routing.

BRIEF SUMMARY OF THE INVENTION

Embodiments of this invention provide a sense architecture for a solid-state memory that reduces the chip area required for realization, particularly in connection with interconnections.

Embodiments of this invention also provide such an architecture in which a great deal of flexibility in the number and size of blocks or sectors is made available.

Embodiments of this invention also provide such an architecture in which parasitic impedances are reduced, thus improving the sensing speed and noise margin for read operations.

Other benefits of embodiments of this invention will be apparent to those of ordinary skill in the art having reference to the following specification together with its drawings.

This invention may be implemented into a memory sense architecture in which adjacent or nearby column decode or select circuits, coupled to neighboring groups of columns in the memory array, drive inputs to the same differential amplifier. In the balanced sense amplifier approach, the selected column resides in one group of columns and its state is communicated to one input of the differential amplifier; the other differential amplifier input receives a reference level, such as that established by a dummy bit line from an adjacent or nearby group of columns. By keeping the sense and reference lines between the final column decode stage and the differential amplifiers near to one another, the chip area can be greatly reduced, thus reducing parasitics and also the chip area required to realize the interconnections. Physical crossovers among the conductors are also not necessary, enabling a less complex manufacturing process.

BRIEF DESCRIPTION OF THE SEVERAL VIEWS OF THE DRAWING

FIG. 3 is an electrical diagram, in block form, illustrating a large-scale logic circuit including an embedded memory constructed according to embodiments of this invention.

FIG. 4 is an electrical diagram, in block form, illustrating the embedded memory in the logic circuit of FIG. 3, realized as a flash memory and constructed according to an embodiment of the invention.

FIG. 7 is an electrical diagram, in schematic form, illustrating the construction of select circuits in combination with a sense amplifier in a memory constructed according to embodiments of this invention.

FIG. 10 is an electrical diagram, in schematic form, illustrating the construction and operation of a local-to-global bit line switch in the memory of FIG. 8, constructed according to another embodiment of the invention.

DETAILED DESCRIPTION OF THE INVENTION

Figure 1A:
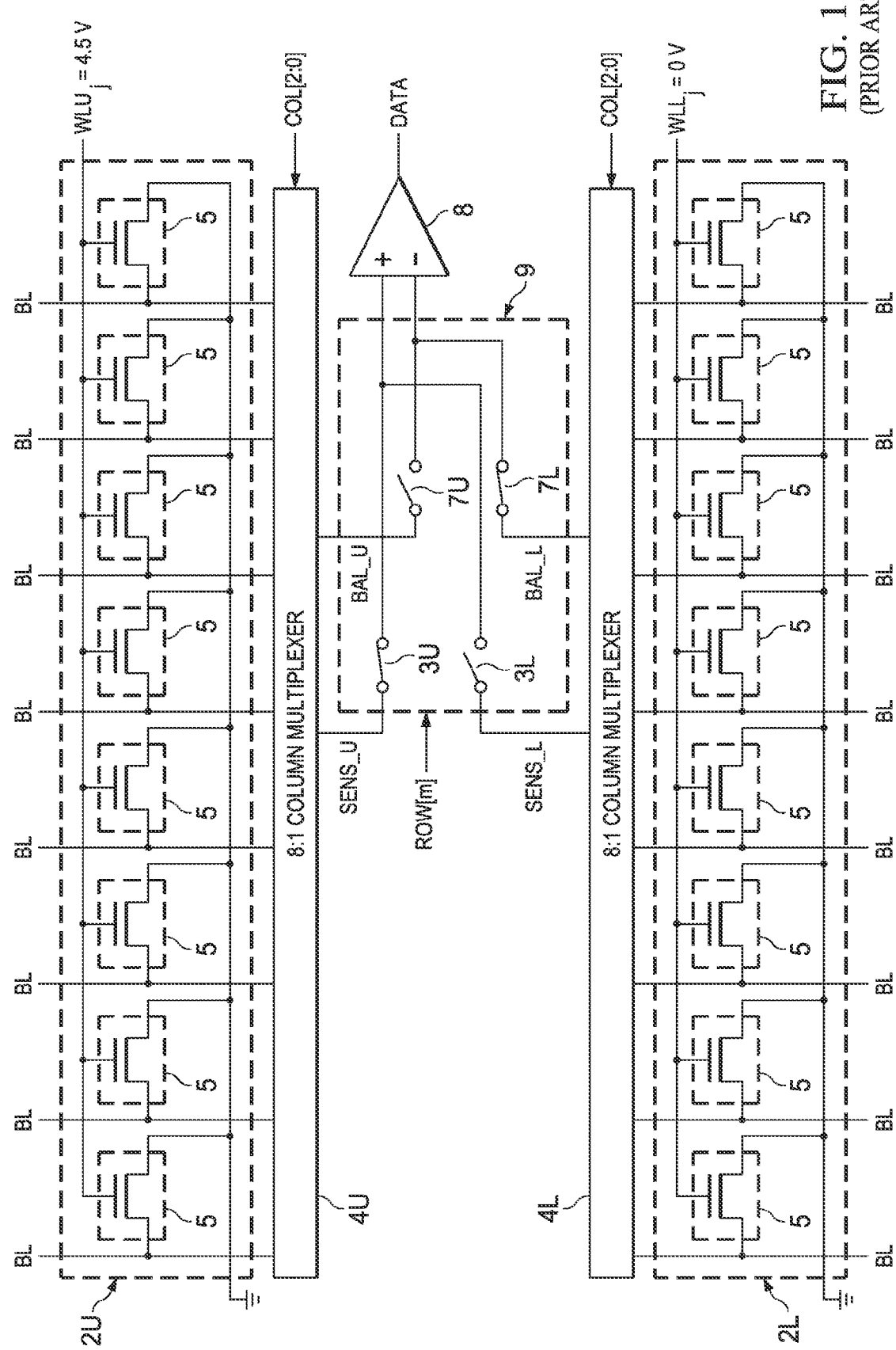
FIGS. 1a and 1b are electrical diagrams, in block and schematic form, that illustrate a memory architecture according to a conventional arrangement.
Figure 1B:
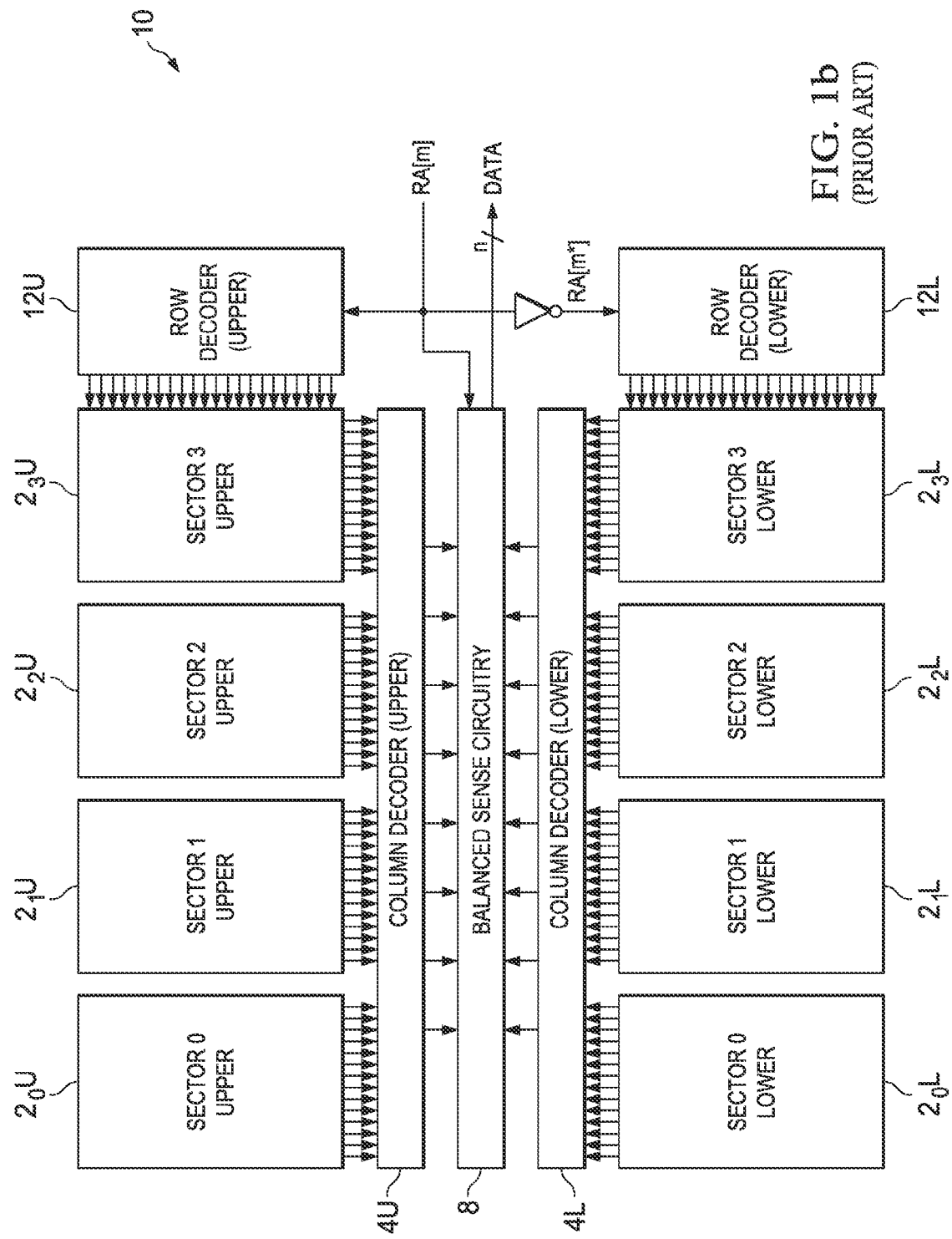
Figure 2A:
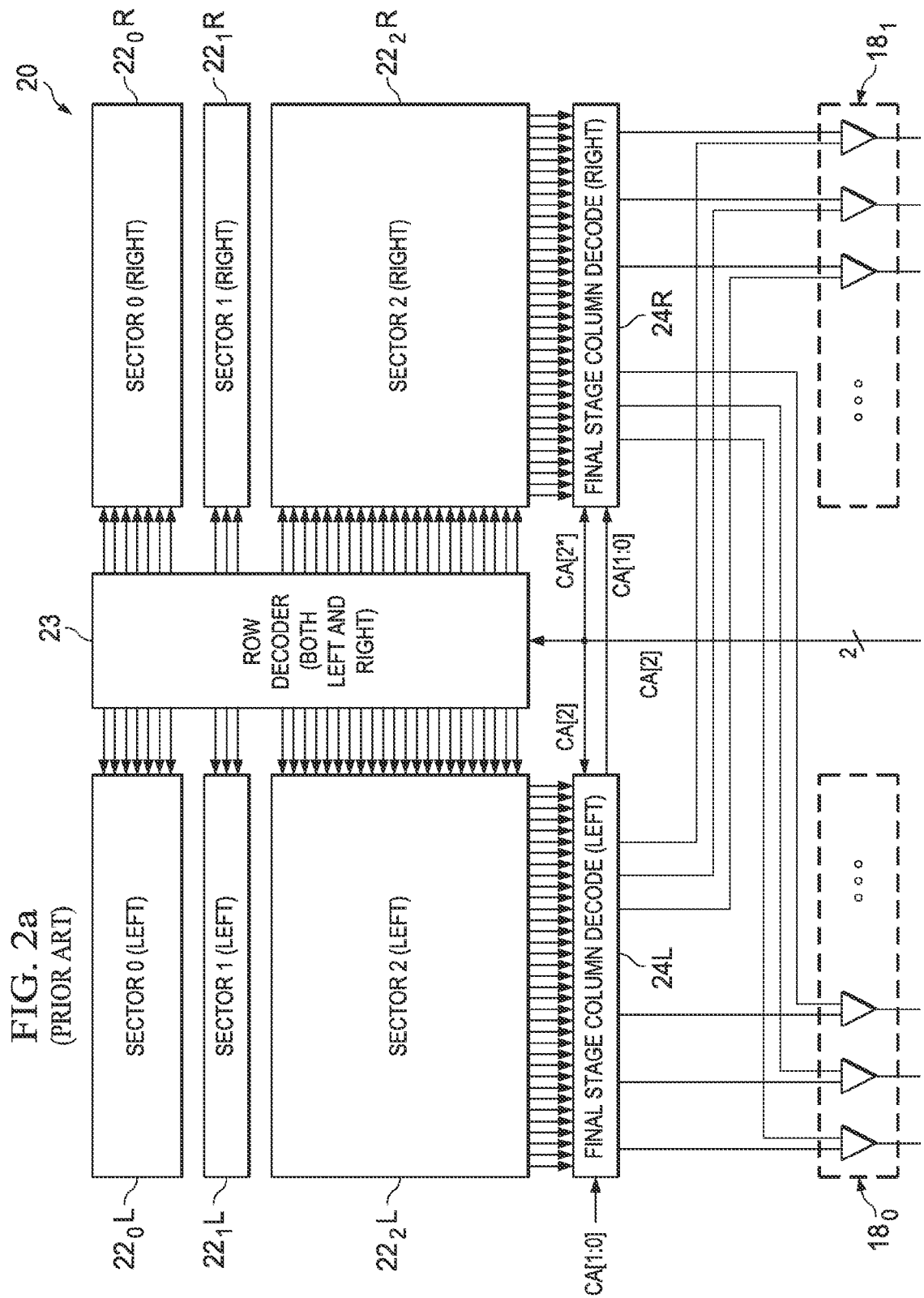
FIGS. 2a and 2b are electrical diagrams, in block and schematic form, that illustrate a memory architecture according to another conventional arrangement.
Figure 2B:
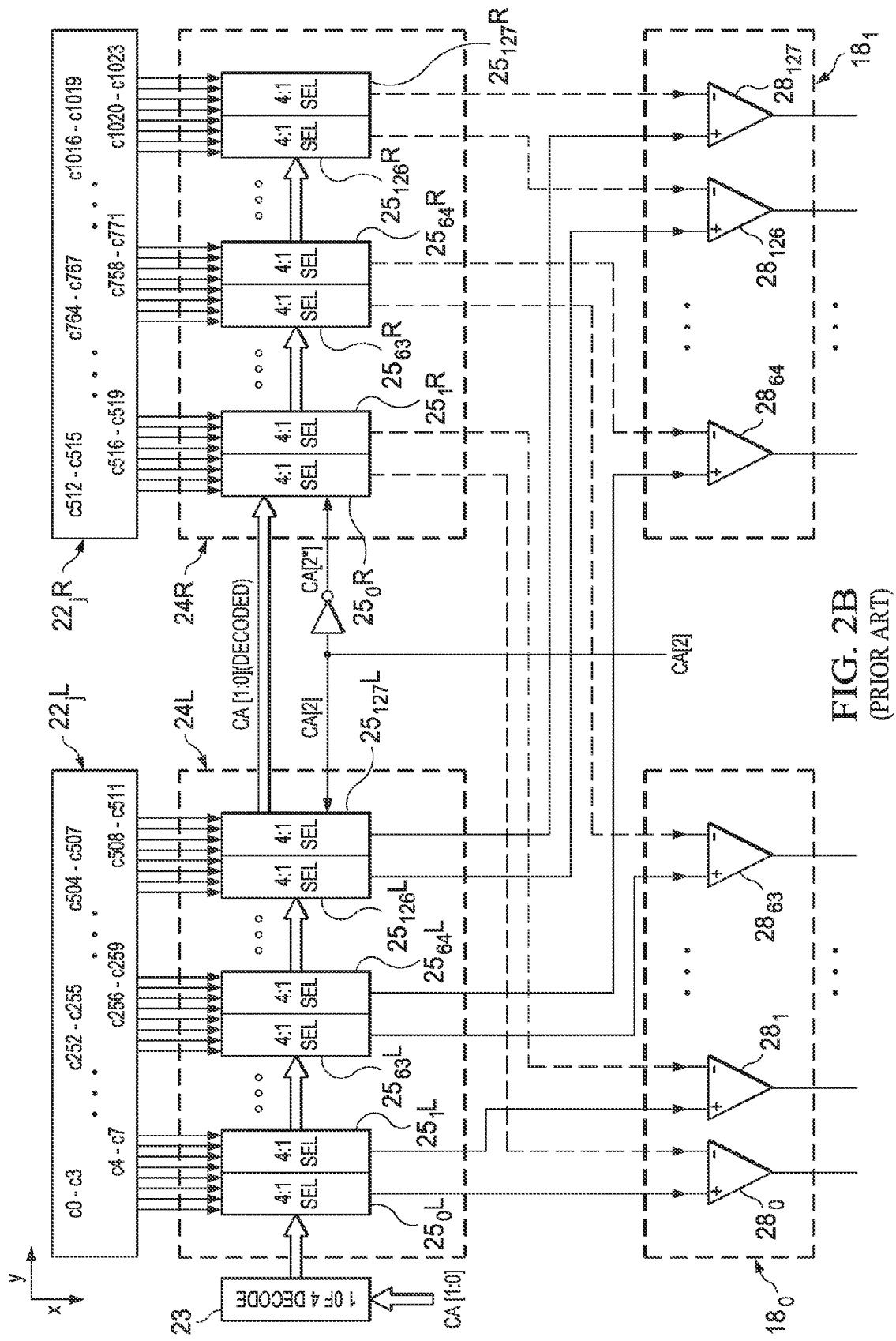

This invention will be described in connection with certain of its embodiments, namely as implemented into a flash memory embedded within a large-scale integrated circuit such as a microprocessor or digital signal processor, because it is contemplated that this invention will be especially beneficial when implemented in such an application. However, it is contemplated that this invention can provide important advantages and benefits in other realizations, including stand-alone flash memory devices and cards, solid-state memory of other types besides non-volatile floating-gate memory, and the like. Accordingly, it is to be understood that the following description is provided by way of example only, and is not intended to limit the true scope of this invention as claimed.

An example of an embodiment of the invention is illustrated, in functional block diagram form, in FIG. 3. Integrated circuit 35 is a large scale integrated circuit, including functional circuitry in combination with embedded electrically erasable read-only (EEPROM) memory 30, all formed in the same integrated circuit die or chip. Memory 30 in this example will be referred to as "flash" memory, in that individual sectors (i.e., "blocks") of the memory are erasable by a single erase operation, as known in the art. Of course, other types of non-volatile memory may alternatively be used, if desired. In this example of FIG. 3, the functional circuitry constitutes central processing unit (CPU) core 32, which is a conventional microprocessor or digital signal processor CPU core as known in the art. Integrated circuit 35 includes such other functions as typical for a large-scale programmable processor, such as random-access memory (RAM) 34, input/output functions 36, and the like, which communicate with CPU core 32 via local bus LBUS. Other circuits such as clock circuits, timers, power management circuits, special functionality, other control circuits such as direct memory access controllers, other functional circuits including other analog and digital circuitry, and the like are also typically included within large scale integrated circuits such as integrated circuit 35.

As will become apparent from this description, flash memory 30 may be realized in a number of different ways according to this invention. Each of these implementations realize flash memory 30 by a relatively large number of floating-gate EEPROM memory cells arranged in rows and columns in an array. As will be apparent from this description, the memory array of flash memory 30 is arranged as multiple sectors. For flash memory 30 in the form of a stand-alone memory device, or for use as bulk data or program storage, the sectors within the memory array will generally be of a uniform size. However, in the embedded memory context, it can be useful to implement the various sectors of various sizes, particularly in the case in which flash memory 30 is erasable on a sector-by-sector basis (i.e., the sector is the smallest unit of erase). In such a case, a small sector may be used for a particular function of integrated circuit 35, such that this sector will periodically be erased as a whole but will only be storing a relatively small block of data (and thus does not require the chip area of a large memory block). It is contemplated that the various embodiments of this invention, and alternatives thereto, are particularly well adapted for use in connection with such multiple-sector flash memory arrays, and in fact enable a great deal of flexibility in sector design in an efficient manner from the standpoint of chip area.

FIG. 4 illustrates one arrangement of flash memory 30, according to an embodiment of the invention in which three sectors $42_0$, $42_1$, $42_2$ of different sizes from one another are included. In this embodiment of the invention, each sector 42 is divided into left and right halves, with row decoder 50 located between the halves. In response to a row address, row decoder 50 will energize a word line connected to the control gates of memory cells in the same row, across both the left and right halves of the sector 42 containing the selected row. In addition, as will be described in detail below, each half sector is split into "top" and "bottom" portions, for purposes of the sense architecture, with an instance of local-to-global bit line switches 44 located between those portions. For example, as shown in FIG. 4, sector $42_2$ thus has four portions including top left sector portion $42_2TL$, top right sector portion $42_2TR$, bottom left sector portion $42_2BL$, and bottom right sector portion $42_2BR$. Within each of these sector portions, the memory cells within the same column will share a "local" bit line, which is local in the sense that this bit line extends only to memory cells within that same sector portion. As will be described below, local-to-global bit line switches 44 control the coupling of local bit lines to global bit lines, to which sense and bias circuitry are coupled. The global bit lines extend the length of the array, from bit line drive and load circuitry 43 to balanced sense amplifiers 48 via final stage column decoders 46, as shown in FIG. 4.

Support circuitry is also provided within flash memory 30, in the conventional manner. As shown in FIG. 4, such support circuitry includes address buffers 41 receiving and forwarding address signals from local bus LBUS, clock circuitry 45c for generating or buffering (or both) clock and other timing and control signals useful in the operation of flash memory 30, power circuitry 45p producing the appropriate bias and regulated voltages and currents, write/erase circuitry 49 for producing and applying the appropriate voltages for programming and erasing memory cells within sectors 42 in the appropriate manner, input/output buffers 51 coupling sense amplifiers 48 and write/erase circuitry 49 to local bus LBUS, and the like. Other circuitry necessary and useful to its operation will also be included in flash memory 30, as known by those skilled in the art.

As mentioned above, global bit lines extend across all sectors 42, and are connected by local/global bit line switches 44 to local bit lines within the sector $42_j$ that contains the selected row. In a read operation, these global bit lines are received by final stage column decoders 46L, 46R, each of which receive and decode those bits of the column address that select one global bit line from each of a number of groups of global bit lines for coupling to a corresponding one of sense amplifiers 48L, 48R. In addition, in this embodiment of the invention, one of the column address bits determines whether the selected global bit line or a reference line (which may itself be a global bit line coupled to a local bit line in an unselected sector portion, or to a reference circuit) for that group is coupled to the positive or negative input of a differential amplifier in those sense amplifiers 48L, 48R. For proper sensing, each of sense amplifiers 48 has an input coupled to a global bit line that in turn is coupled to a local bit line to which a memory cell in the selected row and a selected column is coupled, and also another input to which a global bit line or reference line corresponding to nearby unselected columns is coupled. Lower sense amplifiers 48L present output data bits DATA [0:63] to input/output buffers 51, and upper sense amplifiers 48R present output data bits data [64:127] to input/output buffers 51, in this example of flash memory 30 which presents a 128-bit data word to local bus LBUS.

Figure 5:
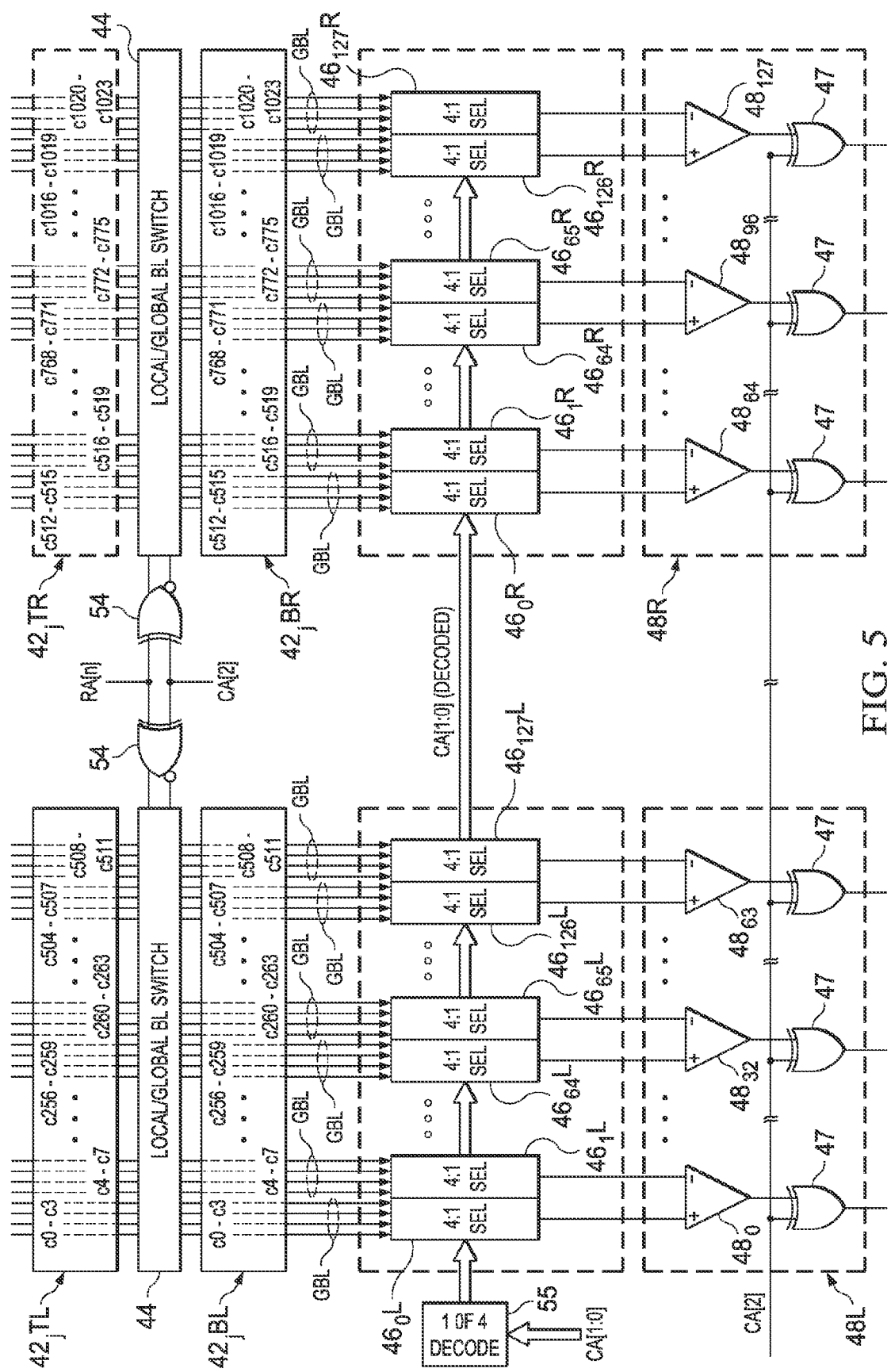
FIG. 5 is an electrical diagram, in block and schematic form, illustrating the interconnection of a sector with sense circuitry in the memory of FIG. 4, constructed according to that embodiment of the invention.

The sense architecture of flash memory 30 of FIG. 4, in this embodiment of the invention, will now be described in more detail in connection with FIG. 5. Sector $42_j$ containing the selected row is shown in FIG. 5, and as described above, this sector $42_j$ is divided into its four portions including top left sector portion $42_j$TL, top right sector portion $42_j$TR, bottom left sector portion $42_j$BL, and bottom right sector portion $42_j$BR. For this 128-bit architecture, top left sector portion $42_j$TL and bottom left sector portion $42_j$BL include columns c0 through c511, while top right sector portion $42_j$TR and bottom right sector portion $42_j$BR include columns c512 through c1023. An instance of local/global bit line switch 44 is disposed between top left sector portion $42_j$TL and bottom left sector portion $42_j$BL, and another instance of local/global bit line switch 44 is disposed between top right sector portion $42_j$TR and bottom right sector portion $42_j$BR.

Each global bit line GBL is associated with a column, and is connected to a corresponding 4:1 select circuit 46 for that column. In this example, global bit lines GBL for columns c0 through c3 are connected to select circuit $46_0$L, global bit lines GBL for columns c4 through c7 are connected to select circuit $46_1$L, and so on through global bit lines GBL for columns c1020 through c1023 connected to select circuit $46_{127}$R. All of 4:1 select circuits 46 receive the two least significant bits of the column address (e.g., CA[1:0]), in this case as decoded by decode circuit 55 into control lines; of course, select circuits 46 may be 2:1, 8:1, or of some other multiplexer ratio, with the number of column address bits controlling that selection corresponding to that ratio. In response to those column address bits, each select circuit 46 connects a selected global bit line GBL to one of the inputs of corresponding sense amplifier 48. In this architecture, each pair of select circuits 46 shares a single sense amplifier 48, in that the outputs of the select circuits 46 in each pair are coupled to respective inputs to the shared sense amplifier 48. For example, select circuits $46_0$L and $46_1$L share sense amplifier $48_0$, with the output of select circuit $46_1$L connected to the negative input of sense amplifier $48_0$, and the output of select circuit $46_0$L connected to the positive input of sense amplifier $48_0$. In this embodiment of the invention, the data states at the outputs of sense amplifiers $48_0$ through $48_{127}$ are reconciled by exclusive-OR gates $47_0$ through $47_{127}$, respectively, to generate the appropriate output logic level according to which group in each pair of groups of four global bit lines is selected. More specifically, in this example, each of exclusive-OR gates $47_0$ through $47_{127}$ performs the exclusive-OR of the output of its corresponding sense amplifier $48_0$ through $48_{127}$ with next most significant column address bit (CA[2]).

Figure 6:
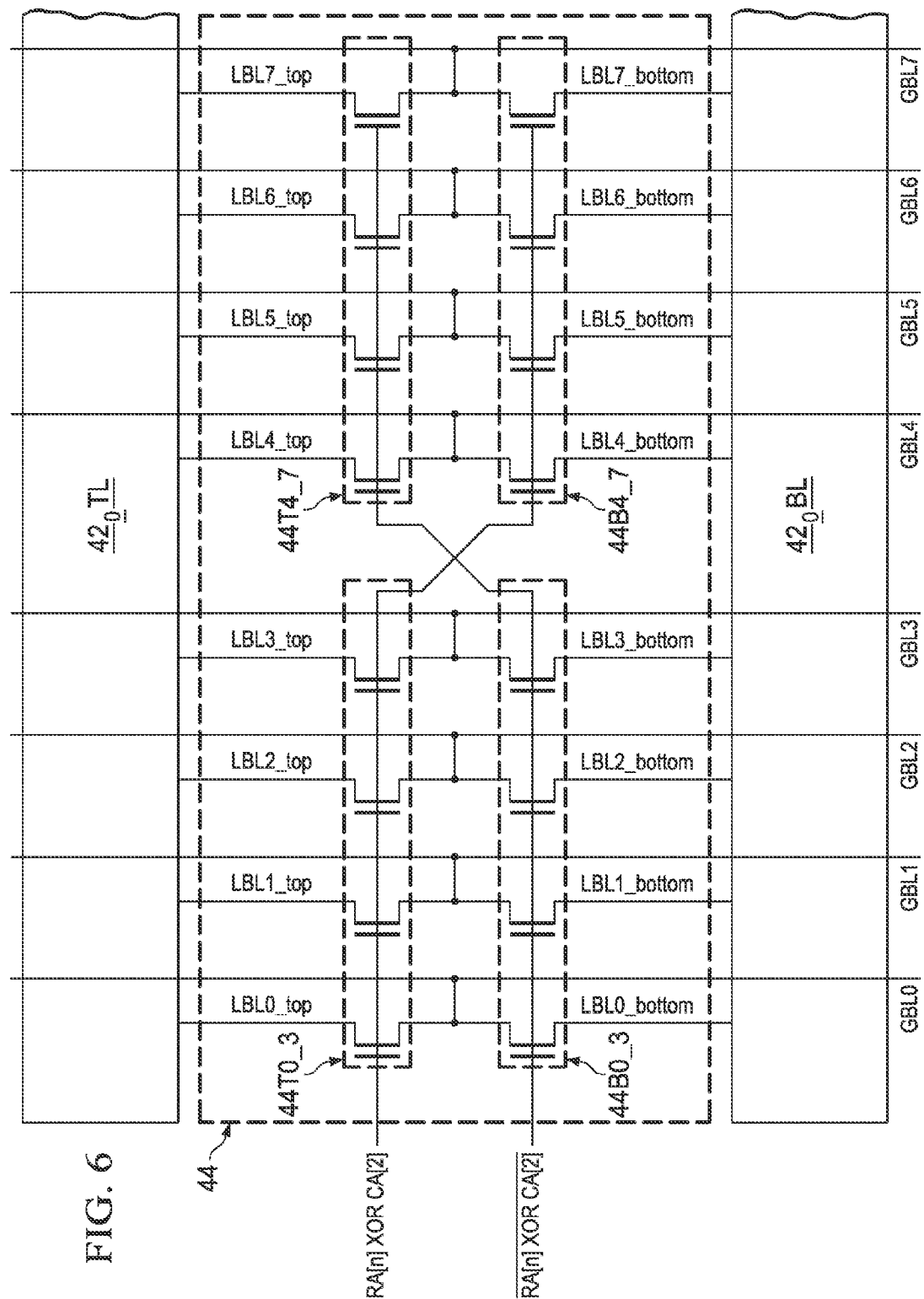
FIG. 6 is an electrical diagram, in schematic form, illustrating the construction and operation of a local-to-global bit line switch in the memory of FIG. 3, constructed according to that embodiment of the invention.

Referring now to FIG. 6, the construction and operation of an instance of local/global bit line switch 44 will now be described, in connection with an embodiment of this invention in which the reference level is established by the load presented by a local bit line of a sector portion $42_j$ in which no row is selected, in combination with a corresponding global bit line. In this embodiment of the invention, the reference level used by sense amplifiers 48 is established by a reference current (e.g., at an intermediate level between that of "0" and "1" data states) applied to the capacitive load of a local bit line of an unselected sector portion plus a global bit line, the combination of which serves as a "dummy" bit line. In this example, small sections of each of top left sector portion $42_0$TL and bottom left sector portion $42_0$BL are shown, specifically the sections including columns c0 through c7. As such, local bit lines LBL0_top through LBL7_top of top left sector portion $42_0$TL and local bit lines LBL0_bottom through LBL7_bottom of bottom left sector portion $42_0$BL are received by local/global bit line switch 44, for possible connection to global bit lines GBL0 through GBL7.

Local/global bit line switch 44 is constructed, in this embodiment of the invention, as a set of banks of pass gates, each pass gate constructed as a metal-oxide-semiconductor (MOS) transistor with its gate controlled by a gate signal driven by logic gate 54 (FIG. 4) in response to the logical combination of a row address bit RA[n] and column address bit CA[2], in this example. The pass gates in each bank operate in common, such that all pass gates within a bank are either on or off at a given time, depending on the output of logic gate 54. In response to being turned on from the output of logic gate 54, pass gate bank 44T0_3 couples local bit lines LBL0_top through LBL3_top to global bit lines GBL0 through GBL3, pass gate bank 44B0_3 couples local bit lines LBL0_bottom through LBL3_bottom to global bit lines GBL0 through GBL3, pass gate bank 44T4_7 couples local bit lines LBL4_top through LBL7_top to global bit lines GBL4 through GBL7, and pass gate bank 44B4_7 couples local bit lines LBL4_bottom through LBL7_bottom to global bit lines GBL0 through GBL3. Within local/global bit line switch 44 in FIG. 5, the gate lines of the banks are interconnected to be controlled by the same output of logic gate 54, comprehending the addressing scheme. In this example as shown in FIG. 5, pass gate banks 44T0_3 and 44B4_7 operate in common, and complementary to pass gate banks 44B0_3 and 44T4_7, which operate in common relative to one another. In other words, pass gate bank 44T0_3 and pass gate bank 44B4_7 turn on and off together, while pass gate bank 44B0_3 and pass gate bank 44T4_7 turn on and off together, in a complementary fashion relative to pass gate bank 44T0_3 and pass gate bank 44B4_7.

In this example, logic gate 54 executes the exclusive-OR of row address bit RA[n] that determines whether the selected row within sector $42_0$ is in the top or bottom sector portions, with column address bit CA[2] that determines, in this example, whether the selected column is within an even-numbered or odd-numbered group of four columns. Logic gate 54 in this embodiment of the invention issues complementary control signals based on the exclusive-OR of these two address bits.

Consider the case in which pass gates 44 are p-channel MOS transistors, a row in top half sector portion $42_0$TL is selected by row address bit RA[n] being "0", and one of columns c0 through c3 is selected by column address CA[2] being "0". In this case, pass gate banks 44T0_3 and 44B4_7 are turned on, and pass gate banks 44B0_3 and 44T4_7 are turned off, in response to the exclusive-OR of row address bit RA[n] and column address CA[2] being at a low level. This condition occurs if a row in sector portion $42_0$TL and one of columns c0 through c3, or a row in sector portion $42_0$BL and one of columns c4 through c7, is being selected. Conversely, pass gate banks 44B0_3 and 44T4_7 are turned on, and pass gate banks 44T0_3 and 44B4_7 are turned off, in response to the exclusive-OR of row address bit RA[n] and column address CA[2] being at a high level. This condition occurs if a row in sector portion 42$_0$BL and one of columns c0 through c3, or a row in sector portion 42$_0$TL and one of columns c4 through c7, is being selected. As will become apparent from the following description, this operation couples the group of four local bit lines containing the selected memory cell to its corresponding global bit lines, and couples the group of four local bit lines coupled to unselected rows (i.e., the dummy bit lines) to the group of four global bit lines paired with those containing the selected row. One of those dummy bit lines will serve as a load or reference against which the level defined by the selected memory cell (i.e., in the selected row and selected column) will be compared.

FIG. 7 illustrates the construction of an instance of a pair of 4:1 select circuits 46$_0$L, 46$_1$L and their operation in coupling the selected global bit line in their respective groups of four to the appropriate input of their associated sense amplifier 48$_0$. Select circuit 46$_0$L receives global bit lines GBL0 through GBL3 at its inputs, and select circuit 46$_1$L receives global bit lines GBL4 through GBL7 at its inputs; both of select circuits 46$_0$L and 46$_1$L are both controlled by column address lines CA[1:0] to select one input, and thus one global bit line, for output on lines SENS_L, SENS_R, respectively. In this example, line SENS_L is coupled to the positive input of sense amplifier 48$_0$ and the line SENS_R is coupled to the negative input of sense amplifier 48$_0$. The output of sense amplifier 48$_0$ is applied to an input of exclusive-OR gate 47$_0$, which receives a logic level based on the state of column address bit CA[2].

According to this embodiment of the invention, a dummy bit line formed of the combination of the local bit line of sectors in which no row is selected (i.e., all word lines are de-selected) and its global bit line presents a capacitance, to the sense amplifier input, that is balanced with the capacitance of the local bit line and global bit line coupled to the addressed memory cell. The reference level against which sense amplifier 48$_0$ compares the state of the selected memory cell is based on a reference current generated in the manner described in U.S. Pat. Nos. 5,528,543 and 5,773,997, incorporated herein by reference, and applied to the capacitance established by the dummy bit line. FIG. 7 illustrates this arrangement by way of current reference circuits 59L, 59R, each of which include a current source (e.g., a MOS transistor biased at the desired level in a current mirror arrangement), and that define reference current levels REF_L, REF_R, respectively, which may, for example, correspond to approximately half the current conducted by a memory cell in its erased state. Switches 51L, 51R within current reference circuits 59L, 59R operate to connect respective reference current levels REF_L, REF_R to their respective sense lines SENS_L, SENS_R, in response to the decoded signal based on column address CA[2].

In operation, column address bits CA[1:0] cause select circuits 46$_0$L and 46$_0$R to each select one global bit line for connection to sense lines SENS_L, SENS_R, respectively. The state of column address bit CA[2] indicates the group of four global bit lines that is to be selected for sensing. For example, if one of columns c0 through c3 is being selected (column address bit CA[2] is "0"), switch 51R is closed to connect reference current REF_R to line SENS_R and thus to the negative input of sense amplifier 48$_0$, and switch 51L is opened to isolate reference current REF_L from sense line SENS_L. The current defined by the selected memory cell, and communicated via the selected one of global bit lines GBL0 through GBL3, is thus applied to the positive input of sense amplifier 48$_0$, while the reference level defined by reference circuit 59R and the dummy bit line capacitance of a local bit line and one of global bit lines GBL4 through GBL7 is applied to the negative input of sense amplifier 48$_0$. The output of sense amplifier 48$_0$ thus represents the sensed data state, which is passed by XOR gate 47$_0$ to output line DATA$_0$ (column address bit CA[2] being "0"). Conversely, if column address bit CA[2] were at a "1" level, indicating that the selected column is one of columns c4 through c7, the reference current on line REF_L would be connected to line SENS_L, such that the reference level would appear at the positive input of sense amplifier 48$_0$ and the level defined by the sensed memory cell on line SENS_R would appear at the negative input to sense amplifier 48$_0$. In this event, XOR gate 47$_0$ would invert the logic level at the output of sense amplifier 48$_0$ so that the proper data state would be communicated on output line DATA$_0$.

Other approaches to managing the sensing of the selected group of four global bit lines can alternatively be used. For example, switches inserted between the outputs of select circuits 46 and inputs of sense amplifier 48, and controlled by the state of column address bit CA[2], can selectably route lines SENS_L and SENS_R to the desired positive and negative inputs of sense amplifier 48, in which case only one instance of reference circuit 59 (connected at all times to the negative input of sense amplifier 48 in this case) is necessary. Further in the alternative, other sensing approaches besides that described in the above-incorporated U.S. Pat. Nos. 5,528,543 and 5,773,997 may be utilized in connection with embodiments of the invention. It is contemplated that those skilled in the art having reference to this specification will be readily able to incorporate this invention in connection with such alternative sense circuitry, without undue experimentation.

Referring back to FIG. 5, the sense arrangement illustrated in FIGS. 6 and 7 is replicated for each pair of groups of four columns across sector 42$_0$. The groups of bit lines (groups of four in this example) are similarly selected given the current address value. As shown in FIG. 5, in the case in which the selected global bit line is within the group GBL0 through GBL3, the positive input of each sense amplifier 48 is coupled to line SENS_L from the left-hand one of its corresponding pair of 4:1 select circuits 46, and its negative input is coupled to line SENS_R from the right-hand 4:1 select circuit 46 in its associated pair. Again, as mentioned above, the addressed and selected row of memory cells extends across the full width of sector 42$_0$.

According to this embodiment of the invention, as described above, the routing of conductors from the final stage column decoders 46L, 46R is greatly simplified and shortened. In the example of FIGS. 4 and 5, a dummy bit line used in sensing of the selected memory cell is provided from an adjacent group of columns. It is contemplated that, in connection with this invention, the dummy bit line need not be provided from an adjacent group of columns but can be provided from a group of columns that is physically near to the group from which the selected column is taken. For example, the dummy bit line may be provided from a group of columns that is separated from the group of columns including the selected column by one or two groups of columns. Chip area is generally minimized, however, by the two groups of columns sharing a sense amplifier being as near to one another as possible. In the example of FIGS. 4 through 6, the current to be sensed from a selected memory cell on one of a group of four bit lines is compared with the level established by a reference current applied to the dummy bit line selected from an adjacent group of four bit lines. Routing of sense and reference lines over long distances of the integrated circuit in which the memory of this embodiment of the invention is realized is avoided, enabling flash memory 30 to be implemented in a more area and cost-efficient manner than in conventional architectures.

In addition, because the selected and dummy bit lines are routed to the sense amplifier from adjacent or nearby groups of columns (i.e., adjacent or nearby final decode stages), the length and thus the parasitic impedance of the conductors coupled to the sense amplifier inputs are closely balanced with one another. Furthermore, as evident from FIG. 5, this close matching of conductor lengths is quite uniform across all columns, further improving the consistency of operation of flash memory 30 in this embodiment of the invention. As evident from the above description, local bit lines to which the memory cells within a sector portion are connected are relatively limited in length, and need only extend to a nearby local/global bit line switch 44. Global bit lines then extend to the select circuits 46 constituting the final stage of column decoding. This further maintains the balance and consistency of sensing in flash memory 30 according to this embodiment of the invention. This improved balance and consistency improves the precision and noise margins in the sensing of stored data states, and thus enables more reliable performance and can also allow for the memory cell size to be reduced with no loss of fidelity.

Furthermore, as apparent from FIG. 4, a great deal of flexibility in arranging the number and sizes of sectors is provided in this embodiment of the invention, while still achieving the benefits of reduced chip area and improved sensing described above. While each sector is split into top and bottom portions, as described above, the number of sectors and the sizes of these sectors can be freely selected for optimal cost and efficiency, given the intended functionality of flash memory 30. This freedom of sector definition is especially useful for embedded memories, such as in integrated circuit 20 of FIG. 3.

Figure 8:
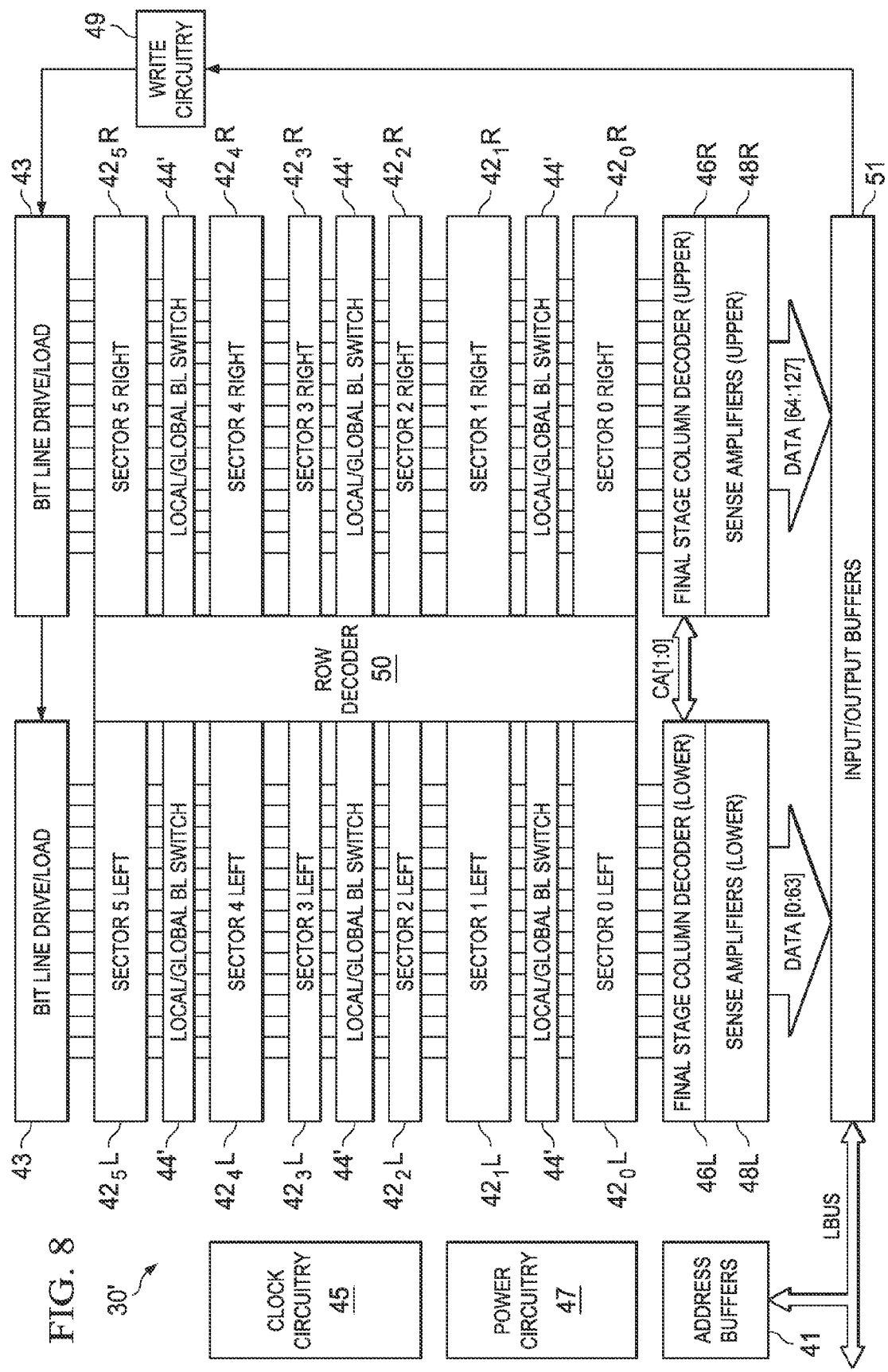
FIG. 8 is an electrical diagram, in block form, illustrating the embedded memory in the logic circuit of FIG. 3, realized as a flash memory and constructed according to another embodiment of the invention.

It is contemplated that many variations in the addressing scheme may be realized in connection with embodiments of this invention. One such variation according to another embodiment of the invention will now be described in connection with flash memory 30' as shown in FIG. 8. In the arrangement of FIG. 8, flash memory 30' includes certain functions and features as does flash memory 30 described above relative to FIGS. 4 through 6, those functions and features referred to by the same reference numerals and operating in a similar fashion. In flash memory 30' of FIG. 8, however, sectors 42 are split into left and right portions $42_jL$, $42_jR$ on opposing sides of row decoder 50, as shown. Adjacent sectors are paired with one another, and share instances of local/global bit line switch 44'. For example, sectors 0 and 1 share instances of local/global bit line switch 44'; more specifically, left sector portions $42_0L$ and $42_1L$ share an instance of local/global bit line switch 44', as do right sector portions $42_0R$, $42_1R$. One or more logic gates (not shown) such as exclusive-OR gate 54 shown in FIG. 5, are provided to generate the logical combinations of the operative decoded address signals for controlling local/global bit line switches 44', as before.

Figure 9:
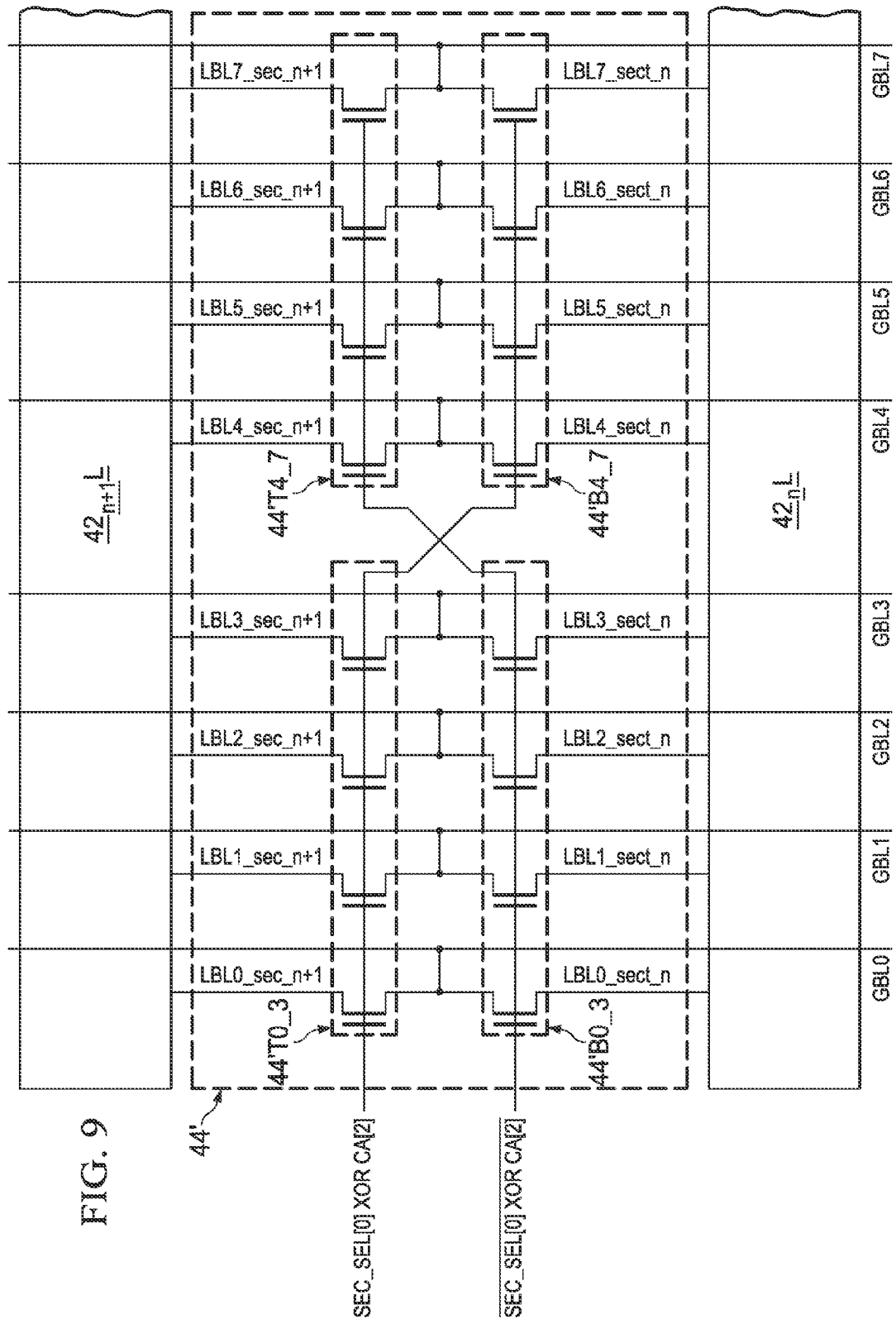
FIG. 9 is an electrical diagram, in schematic form, illustrating the construction and operation of a local-to-global bit line switch in the memory of FIG. 8, constructed according to that embodiment of the invention.

The addressing scheme of FIG. 8 is reflected in the construction of local/global bit line switches 44', as will now be described in connection with FIG. 9. In this example, local bit lines LBL0_sect_n through LBL3_sect_n from sector portion $42_{11}L$ are coupled to global bit lines GBL0 through GBL3 via pass gate bank 44'B0_3, while local bit lines LBL0_sect$_{13}$ n+1 through LBL3_sect_n+1 from sector portion $42_{n+1}L$ are coupled to global bit lines GBL0 through GBL3 via pass gate bank 44'T0_3. Similarly, local bit lines LBL4_sect_n through LBL7_sect_n from sector portion $42_nL$ are coupled to global bit lines GBL4 through GBL7 via pass gate bank 44'B4_7, and local bit lines LBL4_sect_n+1 through LBL7_sect_n+1 from sector portion $42_{n+1}L$ are coupled to global bit lines GBL4 through GBL7 via pass gate bank 44'T4_7. The gates of pass gate banks 44'B0_3 and 44'T4_7 are connected in common, receiving a complementary signal from that applied to the gates of pass gate banks 44'T0_3 and 44'B4_7, which are in common with one another.

By way of explanation of its operation, again consider the case that the pass gates of local/global bit line switch 44' are p-channel MOS transistors. According to this addressing scheme, sector select signal SEC_SEL[0] corresponds to a logical combination of row address bits carried out by row decoder 50, according to which one of sectors n and n+1 is selected (other sector select signals SEC_SEL[k] are generated for selecting among the other sectors 42 in flash memory 30'). In this example, a row in sector portion $42_{11}L$ is selected by sector select signal SEC_SEL[0] being at a low level, and a row in sector portion $42_{n+1}L$ is selected by sector select signal SEC_SEL[0] being at a high level; one of columns c0 through c3 is selected by column address bit CA[2] at a "0" state, and one of columns c4 through c7 is selected by column address bit CA[2] being a "1". As such, if a row in sector $42_n$ is selected along with one of columns c0 through c3, or if a row in sector $42_{n+1}$ is selected along with one of columns c4 through c7, then pass gate banks 44'B0_3 and 44'T4_7 are turned on, and pass gate banks 44'T0_3 and 44'B4_7 are turned off. Conversely, if a row in sector $42_n$ is selected along with one of columns c4 through c7, or if a row in sector $42_{n+1}$ is selected along with one of columns c0 through c3, then pass gate banks 44'T0_3 and 44'B4_7 are turned on, and pass gate banks 44'B0_3 and 44'T4_7 are turned off. As described above in connection with FIG. 6, this operation of local/global bit line switches 44', along with 4:1 select circuits 46 as described above in connection with FIG. 7, couples the bit line to which the selected memory cell is connected by the corresponding word line driven by row decoder 50 to one input of one of sense amplifiers 48, and a bit line in an unselected sector is coupled as a dummy bit line to the other input of that sense amplifier 48.

In this example, select circuits 46 operate in flash memory 30' in the same manner as described above relative to FIGS. 5 through 7. As such, memory array columns are grouped into relatively small groups (i.e., four columns per group), and adjacent pairs of column groups are associated with the same sense amplifier 48. Alternatively, the small groups of columns sharing a sense amplifier may be near but not adjacent to one another, for example with one or two groups of columns disposed between the two groups of columns sharing a sense amplifier. In the case of adjacent groups of columns as in this example, a column address bit that is one place greater in significance than the bits used to select one bit line within each group determines which of each of these pairs of bit line groups contains the selected column, with the same selection carried out across the selected sector. In this example, if column address bit CA[2] is a "0", then each of the left-hand groups of four columns in each pair contains the selected column; if column address bit CA[2] is a "1", then each of the right-hand groups of four columns contains the selected column.

This embodiment of the invention, in which the addressing scheme is varied from that described above relative to FIGS. 4 through 6, provides similar advantages as flash memory 30, in that the routing of conductors from the final stage column decoders to the sense amplifiers is greatly simplified and shortened, enabling realization of the memory in a more area and cost-efficient manner. And also as described above, the parasitic impedances of the routed conductors, as they appear to the sense amplifier inputs, are closely balanced with one another at each sense amplifier, and also across all columns of the memory. The use of global bit lines additionally improves the precision and noise margins in the sense operation, in the same manner as discussed above.

Flash memory 30' also provides additional flexibility in the selection of the numbers and sizes of sectors of memory cells, as compared with conventional memories. However, according to this approach, in which local bit lines of unselected sector portions serve as dummy bit lines to sense amplifier inputs, flash memory 30' in this embodiment of the invention is best implemented with an even number of sectors, with each pair of sectors being of the same size. Sectors in different pairs may, of course, have different numbers of rows (i.e., sizes).

As mentioned above, various sensing approaches may be utilized in connection with embodiments of the invention. The embodiments of the invention described above use local bit lines of sectors in which no row is selected (i.e., all word lines are de-selected) as a dummy bit line that is coupled to an input of the corresponding sense amplifier as a reference load. The dummy bit line established by the local bit line of unselected rows and its global bit line presents a capacitance to the sense amplifier input that is balanced with the capacitance of the local bit line and global bit line coupled to the addressed memory cell. Application of a reference current to that dummy bit line establishes a reference level at the sense amplifier, against which the selected memory cell state is compared. However, according to another embodiment of this invention, unselected local bit lines are not coupled to the global bit lines to establish the dummy bit line capacitance, but the dummy bit line capacitance is instead established by the global bit line capacitance only. According to this embodiment of the invention, if the global bit line capacitance for the unselected group of columns adequately matches the capacitance of the selected local bit line and its global bit line, the chip area required for implementing the local/global bit line switches can be reduced.

FIG. 10 illustrates the construction of local/global bit line switch 44" according to an example of this embodiment of the invention, in which local bit lines of the unselected group of columns are not connected to their corresponding global bit lines. In this example, a single sector portion 42$_n$L is illustrated in connection with its columns c0 through c7, which are arranged in groups of four columns as before. Because local bit lines are not being forwarded via global bit lines to sense amplifiers 48, local/global bit line switch 44" includes only two pass gate banks 44a, 44b for these eight columns c0 through c7. Pass gate banks 44a, 44b are of course replicated for each pair of four-column groups for each sector 42$_n$ in the memory.

In operation, pass gate bank 44a couples local bit lines LBL0_sect_n through LBL3_sect_n to global bit lines GBL0 through GBL3, in response to a logical AND of the sector select signal SEC_SEL[n] with the logical NOT of column address bit CA[2]; conversely, pass gate bank 44b couples local bit lines LBL4_sect_n through LBL7_sect_n to global bit lines GBL4 through GBL7, in response to a logical AND of the sector select signal SEC_SEL[n] with column address bit CA[2]. In other words, if a given sector 42$_n$ L is selected, the pass gate bank 44a, 44b corresponding to the state of column address bit CA[2] is turned on, and the other is turned off. The local bit lines of the unselected group of four columns, in this example, are thus not coupled to their corresponding global bit lines.

This embodiment of the invention provides similar advantages as described above in connection with the other embodiments of the invention, because each sense amplifier receives signals from its associated final stage column decoders over conductors of more similar length and parasitic impedance relative to one another than in conventional arrangements, regardless of which of its associated final stage column decoders is selected. As before, these conductors are not only of similar length and properties, but are of reduced length because of the proximity of both to the associated sense amplifier. The input loading is thus more consistent at the sense amplifiers across the memory according to this balanced sense amplifier arrangement, while providing a great deal of flexibility in the assignment of the number and sizes of sectors, as is especially useful in embedded memories.

It is of course contemplated that those skilled in the art having reference to this specification will recognize that other sense arrangements, and also other addressing schemes, can be used in connection with this invention and thus obtain one or more of the important advantages of reduced chip area, reduced routing complexity, improved parasitic impedance matching and uniformity across the memory, and a great deal of flexibility in the arrangement of memory sectors and blocks. As such, while the present invention has been described according to various embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed.

What is claimed is:

1. A memory in an integrated circuit, comprising:
a plurality of memory cells arranged in rows and columns in a plurality of sector portions, the memory cells in each column within a sector portion coupled to a bit line associated with that column;
row decoder circuitry for selecting a row of memory cells responsive to a row portion of an address;
a plurality of column select circuits grouped in pairs, each column select circuit associated with one of a plurality of groups of adjacent columns and for selecting one of the columns in its group responsive to a column address portion of the address, each pair of column select circuits associated with groups of columns disposed near one another;
a plurality of sense amplifiers, each sense amplifier having first and second inputs, each sense amplifier associated with a pair of column select circuits;
a plurality of global bit lines, each global bit line associated with a single column of memory cells; and
local/global bit line switch circuitry for coupling local bit lines of columns of a sector portion selected by a portion of the address to corresponding global bit lines;
wherein the memory cells in each column within each sector portion are coupled to a local bit line associated with that column and that sector portion;
and wherein the pairs of column select circuits operate to select a column by one of the plurality of column select circuits in the pair coupling the global bit line associated with the selected one of the columns in its group to an input of its associated sense amplifier.

2. The memory of claim 1, wherein the local/global bit line switch circuitry couples global bit lines to corresponding local bit lines of columns of the selected sector portion that are in the group of columns, in each pair of groups, containing a column selected by the column address portion of the address.

3. The memory of claim 1, wherein each pair of column select circuits is associated with adjacent groups of columns.

4. The memory of claim 1, further comprising:
a plurality of logic gates, each associated with one of the plurality of sense amplifiers, for selectively inverting a logic state at the output of the sense amplifier responsive to the column address portion of the address.

5. A memory in an integrated circuit, comprising:
a plurality of memory cells arranged in rows and columns in a plurality of sector portions, the memory cells in each column within a sector portion coupled to a bit line associated with that column;
row decoder circuitry for selecting a row of memory cells responsive to a row portion of an address;
a plurality of column select circuits grouped in pairs, each column select circuit associated with one of a plurality of groups of adjacent columns and for selecting one of the columns in its group responsive to a column address portion of the address, each pair of column select circuits associated with groups of columns disposed near one another;
a plurality of sense amplifiers, each sense amplifier having first and second inputs, each sense amplifier associated with a pair of column select circuits;
a plurality of global bit lines, each global bit line associated with a column of memory cells; and
local/global bit line switch circuitry for coupling local bit lines of columns of a sector portion selected by a portion of the address to corresponding global bit lines;
wherein the memory cells in each column within each sector portion are coupled to a local bit line associated with that column and that sector portion;
wherein the local/global bit line switch circuitry couples global bit lines to corresponding local bit lines of columns of the selected sector portion that are in the group of columns, in each pair of groups, containing a column selected by the column address portion of the address;
and wherein the local/global bit line switch circuitry also disconnects global bit lines from corresponding local bit lines of columns in the group of columns, in each pair of groups, not containing a column selected by the column address portion of the address.

6. A memory in an integrated circuit, comprising:
a plurality of memory cells arranged in rows and columns in a plurality of sector portions, the memory cells in each column within a sector portion coupled to a bit line associated with that column;
row decoder circuitry for selecting a row of memory cells responsive to a row portion of an address;
a plurality of column select circuits grouped in pairs, each column select circuit associated with one of a plurality of groups of adjacent columns and for selecting one of the columns in its group responsive to a column address portion of the address, each pair of column select circuits associated with groups of columns disposed near one another;
a plurality of sense amplifiers, each sense amplifier having first and second inputs, each sense amplifier associated with a pair of column select circuits;
a plurality of global bit lines, each global bit line associated with a column of memory cells; and
local/global bit line switch circuitry for coupling local bit lines of columns of a sector portion selected by a portion of the address to corresponding global bit lines;
wherein the memory cells in each column within each sector portion are coupled to a local bit line associated with that column and that sector portion;
wherein each pair of column select circuits is associated with adjacent groups of columns;
and wherein the local/global bit line switch circuitry couples global bit lines to the corresponding local bit lines of columns of the selected sector portion that are in the group of columns, in each pair of groups, containing a column selected by the column address portion of the address, and also couples, for each pair of groups, global bit lines to the corresponding local bit lines of columns of an adjacent unselected sector portion that are in the adjacent group of columns.

7. The memory of claim 6, wherein the plurality of memory cells arranged in rows and columns in a plurality of sectors;
wherein each sector comprises upper and lower sector portions;
wherein the local/global bit line switch circuitry comprises:
a plurality of sets of pass gate banks, each set of pass gate banks disposed between upper and lower sector portions of one of the sectors;
and wherein each set of pass gate banks couples global bit lines to the corresponding local bit lines of columns of the selected upper or lower sector portion that are in the group of columns, in each pair of groups, containing a column selected by the column address portion of the address, and also couples, for each pair of groups, global bit lines to the corresponding local bit lines of columns of the unselected upper or lower sector portion that are in the adjacent group of columns.

8. The memory of claim 7, wherein the number of sectors is odd.

9. The memory of claim 6, wherein the plurality of memory cells arranged in rows and columns in a plurality of sectors;
wherein each sector comprises left and right sector portions;
wherein the row decoder circuitry is disposed between the left and right sector portions of the plurality of sectors;
wherein the local/global bit line switch circuitry comprises:
a plurality of sets of pass gate banks, each set of pass gate banks disposed between sector portions of adjacent sectors;
and wherein each set of pass gate banks couples global bit lines to the corresponding local bit lines of columns of the selected sector that are in the group of columns, in each pair of groups, containing a column selected by the column address portion of the address, and also couples, for each pair of groups, global bit lines to the corresponding local bit lines of columns of the unselected adjacent sector that are in the adjacent group of columns.

10. A memory in an integrated circuit, comprising:
an array of memory cells arranged in rows and columns, the array separated into a plurality of sector portions, the memory cells in each column within a sector portion coupled to a bit line associated with that column;
row decoder circuitry for selecting a row of memory cells responsive to a row address;
a plurality of final stage column select circuits grouped into pairs, each column select circuit coupled to bit lines associated with a unique group of adjacent columns in the array and for selecting one of the columns in its group responsive to a first portion of a column address, the final stage column select circuits in each pair associated with groups of columns disposed near one another in the array, wherein a second portion of the column address selects one of the groups of columns within each pair;

a plurality of sense amplifiers, each sense amplifier having first and second inputs coupled to outputs of an associated pair of the final stage column select circuits a plurality of global bit lines, each global bit line associated with a column of the array; and local/global bit line switch circuitry for selectively coupling local bit lines of columns of a sector portion to corresponding global bit lines;

wherein the global bit lines are connected to the final stage column select circuits for corresponding columns;

further wherein the memory cells in each column within each sector portion are coupled to a local bit line associated with that column and that sector portion.

11. The memory of claim 10, wherein the local/global bit line switch circuitry comprises a plurality of sets of banks of pass gates, each set of banks of pass gates associated with adjacent sector portions, each pass gate bank connected between the local bit lines of columns of a sector portion and associated global bit lines and associated with a group of columns in that sector portion, and controlled by an address portion comprising the second portion of the column address.

12. The memory of claim 11, wherein, within the set of pass gates banks adjacent to a sector portion containing the selected row, the pass gate banks associated with sector portions containing the selected row and a group of columns selected by the second portion of the column address are controlled to connect its associated local bit lines to the associated global bit lines, and the pass gate banks associated with an adjacent sector portion to that containing the selected row and the group of columns in the same pair of groups of columns as that selected by the second portion of the column address are controlled to disconnect its associated local bit lines from the associated global bit lines.

13. The memory of claim 11, wherein, within the set of pass gates banks adjacent to a sector portion containing the selected row, the pass gate banks associated with sector portions containing the selected row and a group of columns selected by the second portion of the column address are controlled to connect its associated local bit lines to the associated global bit lines, and the pass gate banks associated with an adjacent sector portion to that containing the selected row and the group of columns in the same pair of groups of columns as that selected by the second portion of the column address are controlled to connect its associated local bit lines to the associated global bit lines.

14. The memory of claim 13, wherein the array comprises a plurality of sectors;

wherein each sector comprises upper and lower sector portions;

and wherein each set of pass gate banks is disposed between and associated with upper and lower sector portions of one of the sectors.

15. The memory of claim 13, wherein the array comprises a plurality of sectors;

wherein each sector comprises left and right sector portions;

wherein the row decoder circuitry is disposed between the left and right sector portions of the plurality of sectors;

and wherein each set of pass gate banks is disposed between and associated with sector portions of adjacent sectors.

16. The memory of claim 10, wherein each pair of final stage column select circuits are associated with adjacent groups of columns.

17. The memory of claim 10, further comprising:

a plurality of logic gates, each associated with one of the plurality of sense amplifiers, for selectively inverting a logic state at the output of the sense amplifier responsive to the second portion of the column address.

* * * * *